United States Patent [19]
Petropoulos

[11] 4,131,465
[45] Dec. 26, 1978

[54] RADIATION SENSITIVE POLYMERIC O-NITROPHENYL ACETALS AND ELEMENT

[75] Inventor: Constantine C. Petropoulos, Webster, N.Y.

[73] Assignee: Eastman Kodak Company, Rochester, N.Y.

[21] Appl. No.: 836,987

[22] Filed: Sep. 27, 1977

Related U.S. Application Data

[62] Division of Ser. No. 684,696, May 10, 1976, Pat. No. 4,086,210.

[51] Int. Cl.² .............................................. G03C 1/94
[52] U.S. Cl. .................................... 96/35; 96/115 R; 96/35.1; 204/159.21; 96/86 P
[58] Field of Search .................. 96/115 R, 86 P, 35.1, 96/1.5, 35; 204/159.21; 260/67 A, 67 FT

[56] References Cited

U.S. PATENT DOCUMENTS 3,984,378  10/1976  Kubota et al. ..................... 260/67 A
3,991,033  4/1976   Kaiser et al. ..................... 260/67 FP Primary Examiner—John D. Welsh
Attorney, Agent, or Firm—Arthur H. Rosenstein

[57] ABSTRACT

Radiation-sensitive linear polymers comprise repeating structural units containing an o-nitrophenyl acetal. The polymer is formed, for example, by the linear polycondensation of o-nitrobenzaldehyde with a particular dihydroxy alcohol. The polymers are useful as coatings to form positive-working radiation-sensitive elements such as photoresists or lithographic printing plates.

18 Claims, No Drawings

RADIATION SENSITIVE POLYMERIC O-NITROPHENYL ACETALS AND ELEMENT

This is a division of application Ser. No. 684,696, filed May 10, 1976, now U.S. Pat. No. 4,086,210.

BACKGROUND OF THE INVENTION

1. Field of the Invention

This invention relates to radiation-sensitive linear polymeric o-nitrophenyl acetals suitable for use in the graphic arts. In particular, it pertains to radiation-sensitive poly(o-nitrophenyl acetals) formed, for example, by the linear polycondensation of o-nitrobenzaldehyde with organic diols, especially diols having a cyclic nucleus. Furthermore, the invention relates to the polyesterification of a monomer of the polyacetal, or the polyacetal itself, with, for example, an arylene dibasic acid chloride, and endcapping terminal hydroxy groups of the polyacetal by esterification with a monobasic organic acid.

2. Prior Art

Light-sensitive, positive-working polymers have been used for photoresists and on lithographic plates. Exposure of the sensitive polymer through an image-bearing intermediate element results in a solubility differential between the exposed and unexposed areas of the polymer such that treatment with an appropriate solvent washes away the exposed regions leaving the desired positive image areas for viewing on a support.

Polymers containing quinone diazide groups have drawn significant attention in the art for their good wear, printing, and developability characteristics. Such materials are disclosed, for example, in U.S. Pat. Nos. 3,759,711 (issued Sept. 18, 1973 to F. J. Rauner et al) and 3,859,099 (issued Jan. 7, 1975 to C. C. Petropoulos). Such polymers, however, are prone to thermal degradation at room temperature or higher temperatures. To prevent degradation, storage at low temperatures (0°–5° C.) is required.

Alternatively, it has been proposed in the art to use materials with light-sensitive o-nitroaromatic moieties appended indirectly to a polymer backbone. ("Indirectly appended", in this regard, refers to the presence of an intervening group linking the o-nitroaromatic moiety with the backbone). See, for example, U.S. Pat. No. 3,849,137. Upon exposure to actinic radiation, the nitroaromatic group is released, leaving the polymer backbone intact. While such polymers appear to be more thermally stable than quinone diazides, the presence of an intact polymer backbone after exposure unfortunately hinders the ability of developing solutions to clean out non-image areas. Though, on one hand, the presence of a polymer backbone is undesirable after exposure, on the other, a polymer is generally necessary to provide developer and etch resistance and aid in rendering the photosensitive material coatable in the preparation of a radiation-sensitive element.

More recently, as reported by Shirai and Tanaka in the Journal of Applied Polymer Science, Volume 17, (1973), pp. 1617–1619, styrene and 2-(o-nitrophenyl)-1,3-dioxolane were cationically copolymerized to form a copolymer having o-nitrophenyl groups attached directly (i.e., without intervening linking groups) to a polymer backbone. It was theorized that such a polymer would depolymerize upon irradiation. The theory, however, is questionable in light of experimental data disclosed in the article. Furthermore, Shirai and Tanaka indicated that many attempts to increase the molecular weight of their evaluated copolymer were unsuccessful. By independent analysis, applicant has demonstrated that polymers and copolymers of the cationic polymerization type disclosed by Shirai and Tanaka are not useful in a radiation-sensitive element under normal conditions of use. In particular, when such polymers or copolymers were coated on an aluminum support, exposed to ultraviolet radiation, and subsequently treated with an aqueous alcoholic or an aqueous alcoholic alkaline developer composition, no image appeared.

SUMMARY OF THE INVENTION

The invention comprises a radiation-sensitive linear polymer comprising recurring units of the structure

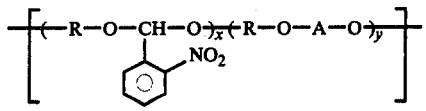

When employed in a radiation-sensitive element as a layer on a support, the polymer forms a positive image when it is exposed to actinic radiation, and thereafter treated with a developing solution. In contrast to the prior art, the polymer in accordance with the invention remains stable at room temperature and higher. Furthermore, upon imagewise exposure of a layer of the polymer on a support, the polymer depolymerizes to provide enhanced removability of the exposed regions of the polymer layer.

In the repeating unit shown above:

(a) R is the residue of an organic diol, i.e., that portion of the diol molecule remaining after removal of the two hydroxyl radicals, which diol is capable of forming a linear polyacetal with an aldehyde by conventional polyacetal-forming techniques as described herein. In a presently preferred embodiment, R is selected from the group consisting of a divalent alkylene group having 5 to 15 carbon atoms, such as pentylene, hexylene and the like; a divalent linear alkylene group with from 4 to 15 carbon atoms and which is interrupted with one or more hetero atoms, such as nitrogen, oxygen, sulfur, and the like; a divalent moiety comprising at least one divalent carbocyclic group having a cyclic nucleus with from 4 to 7 carbon atoms, such as cyclobutylene, cyclohexylene and the like;

(b) A has the formula

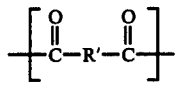

where R' is an arylene group, such as phenylene, naphthalenediyl, and the like; and (c) x ranges from 1 to 20 and y is 0 or 1.

In accordance with the invention, repeating units of various classes are contemplated by the above generic structure. In one embodiment of the shown structure, y is 0 thereby forming a polyacetal recurring unit. In a presently preferred embodiment, y is 1 thereby forming a polyesteracetal repeating unit. In this regard, two classes of polyesteracetal — when x is 1 and when x is from 2 to 20 — are particularly useful.

In yet another preferred embodiment, polymeric compounds bearing repeating units of the above type, where y is 0, and further having terminal hydroxy groups, are esterified with a monobasic organic acid or monobasic functional derivative of an organic acid. The resulting "end-capped" polyacetal exhibits enhanced resistance to acid hydrolysis.

DETAILED DESCRIPTION OF THE PREFERRED EMBODIMENTS

Radiation-sensitive linear polymers in accordance with the invention comprise recurring units of the structure

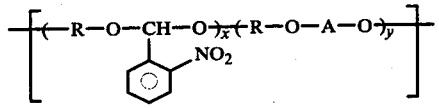

It is noted that this polymer has the o-nitrophenyl moiety appended directly to a polymer backbone. This polymer, in contrast to the prior art polymers with such moiety appended directly to a polymer backbone, is capable of forming a positive image in a layer thereof on a support, when imagewise exposed to conventional amounts of incident actinic radiation (for example, that amount provided by a commercial ultraviolet light copying device to a layer of the polymer on a support transported through such device at a speed of 2 feet per minute) and thereafter treated with a developing solution. Furthermore, in contrast to prior art polymers having o-nitrophenyl moieties appended indirectly to a polymer backbone, polymers of the invention degrade in a stepwise manner (as described hereinafter) thereby leaving lower molecular weight fractions which are readily and efficiently removed by processing solutions.

In the above generic structure, x can range from 1 to 20 and y is either 0 or 1. The group R is a divalent residue of an organic diol (i.e., that portion of the diol molecule remaining after the removal of the two hydroxyl radicals) of a particular class. For convenience such a diol may be shown as

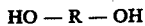

In particular, useful diols from which R is derived must be capable of forming a linear polyacetal with o-nitrobenzaldehyde or dialkyl o-nitrophenyl acetal, preferably by conventional techniques. Techniques, which are suitable to determine useful diols, are readily apparent to those skilled in the art and include, for example, either the polycondensation of an aldehyde with an appropriate organic diol, or the acetal exchange of a dialkyl acetal with an appropriate organic diol. Both techniques are described in *Encyclopedia of Polymer Science and Technology*, Volume 10, pp. 319-323 (John Wiley & Sons, 1969). An appropriate diol essentially is one which avoids the formation of a cyclic non-polymeric compound or a cyclic polyacetal. Detailed information in regard to appropriate diols whose residues are useful in the above linear structure can be found in U.S. Pat. No. 2,968,646 (issued on Jan. 17, 1961 to J. R. Caldwell et al); *Encyclopedia of Polymer Science and Technology*, Volume 10 pp. 319-323 (John Wiley & Sons, 1969); *Journal of Polymer Science*, Volume 2, pp. 2489-2493 (1964); *Journal of Polymer Science*, Volume XLIX, pp. 277-282 (1961); and *Journal of Polymer Science*, Volume 59, pp. 87-92, (1962).

In a preferred embodiment, R is selected from the group consisting of a linear alkylene group with from 5 to 15 carbon atoms, such as pentylene, hexylene and the like; an alkylene group with from 4 to 15 carbon atoms interrupted with at least one hetero atom; and a divalent moiety comprising at least one divalent carbocyclic group having a cyclic nucleus with 4 to 7 carbon atoms, such as cyclobutylene, cyclohexylene, norbornylene and the like.

Useful linear alkylene groups having 5 to 15 carbon atoms include, for example, the residue of any one of 1,5-pentanediol; 1,6-hexanediol; 1,7-heptanediol; 1,15-pentadecanediol; and the like, such as lower alkyl substituted alkylene diols. It is expected that other such linear diols will also be useful so long as they are capable, under conditions known in the art, of forming linear polyacetals as above described.

As noted, R can also be an alkylene group having 4-15 carbon atoms interrupted with at least one hetero atom (such as oxygen, sulfur, nitrogen and the like). R can also be a divalent moiety comprising at least one divalent carbocyclic group having a cyclic nucleus with 4 to 7 carbon atoms. In general, R groups containing a divalent carbocyclic group, are derived from diols containing cyclic nuclei as described in U.S. Pat. No. 2,968,646 issued on January 17, 1961 to J. R. Caldwell et al.

For example, useful cyclic diol derivatives are those comprising cyclobutylene; cyclopentylene; cyclohexylene; norcamphylene; norbornylene and the like. Specific derivatives include those from 1,4-cyclohexanedimethanol; 1,2-cyclohexanedimethanol; 2,3-norcamphanedimethanol; 2,5-norcamphanedimethanol; 2,6-norcamphanedimethanol; 2,5-norcamphanediol; 2,2,4,4,-tetramethyl-1,3-cyclobutanediol; and related cyclic hydrocarbon diols. Preferred cyclic R groups are those containing either cyclobutylene or cyclohexylene.

Particularly useful cyclohexylene containing R groups are any of the following:

1,4-cyclohexylene
1,4-cyclohexylenebisalkylene
1,4-cyclohexylenebis(oxyalkylene)
alkylenebis(1,4-cyclohexylene)

Typical cyclobutylene containing R groups are unsubstituted; but 1,3-cyclobutylene nuclei are preferably substituted in the 2 and 4 positions with lower alkyl. A most preferred substituted cyclobutylene nuclei is, for example, 2,2,4,4-tetramethyl-1,3-cyclobutylene.

In the above shown generic structure, various classes of polymers are contemplated, depending on the values herein assigned to x and y respectively. Linear polyacetals and two classes of polyesteracetals are especially useful. Each of these classes of polymers is described in greater detail below.

Polyacetals

When y is 0, the above generic structure reduces to a linear o-nitrophenyl polyacetal. Such polyacetals can be manufactured by the polycondensation of an organic diol, as described above, with o-nitrobenzaldehyde. Suitable techniques are described in the *Encyclopedia of Polymer Science and Technology*, Volume 10, pp. 319-323 (John Wiley & Sons, 1969). Alternatively, an acetal interchange reaction (also described in the foregoing reference) of any one of the aforementioned diols with a dialkyl o-nitrophenyl acetal can be employed to produce the desired polymer.

The radiation-sensitive polymeric acetals of this invention are preferably within the molecular weight range of 2000 to 4500, although wider molecular weight ranges can be employed. Molecular weight, it should be understood, unless otherwise stated, is the number average molecular weight as determined by vapor phase osmometry. As is well understood in the art, molecular weight and inherent viscosities of polymers are interrelated so that polymers can be usefully delineated in terms of either molecular weight or inherent viscosity. Preferably, the inherent viscosities (determined, unless otherwise stated, using 0.25 gram of the polymer per deciliter of 1,2-dichloroethane at 25° C.) of the radiation-sensitive polymeric acetals of this invention fall within the range of from 0.06 to 0.10.

Polyesteracetals

When y is 1, and A is a dibasic acid residue represented by the formula:

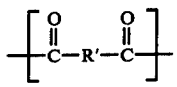

where R' is arylene as described, preferably phenylene, the above generic structure of polymers in accordance with the invention reduces to a subgeneric polyesteracetal. Two general classes of such a polyesteracetal, structurally depicted as I -[(acetal monomer)- dibasic acid residue-]-
II -[(acetal polymer)- dibasic acid residue-]-
are particularly useful.

Polyesteracetal polymers such as I above are within the generic structure of polymers of the invention when x and y are 1 and formulated by reacting a diol as specified herein, with o-nitrobenzaldehyde, in a molar ratio of 2:1 diol:aldehyde, and thereafter esterifying the resulting acetal monomer with a one molar equivalent of the arylene dibasic acid chloride,

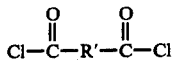

wherein R' is arylene, such as 1,4-phenylene; 1,3-phenylene; 2,6-naphthalenediyl and the like.

Most preferred polyesteracetal polymers are of the formula II variety. They are within the generic structure of polymers of the invention when x ranges from 2 to 20 and y is 1, and can be made by polyesterifying an above noted arylene dibasic acid chloride with a linear polyacetal reaction product of o-nitrobenzaldehyde with the dihydroxy alcohols in accordance with the invention. Preferred alcohols are those containing a cyclic nucleus, for example, 1,4-cyclohexylenedimethanol. With formula II polyesteracetal structures, relatively high molecular weight polymers (compared to the polyacetals described herein) are achievable hence enhancing their coatability on a support. Polymer II inherent viscosities generally range from 0.15 to 0.25 and, preferably are about 0.18.

End-Capped Polyacetals

While polyacetals in accordance with the invention (y is 0) are resistant to acid hydrolysis, such as in hydrofluoric acid, "end-capping" the polymer enhances such resistance. That is, when the above polyacetals terminate in hydroxyl groups, they can be esterified with a monobasic organic acid or derivitive of a monobasic acid, such as benzoyl chloride and the like. Acid resistance, in this regard, is significant when these polyacetals later encounter an acid environment such as in lithographic fountain solutions.

Polyacetals, polyesteracetals, or end-capped polyacetals described herein can be formulated into a coating composition by dispersing or dissolving any one of the polymers in a suitable solvent or combination of solvents used in the art to prepare polymer dopes. Such solvent(s) must, of course, be substantially unreactive toward the radiation-sensitive polymers within the time period contemplated for maintaining the solvent and polymer in association and which are substantially incapable of degrading a substrate employed with the coating composition. Solvents are preferably organic solvents, for example, dimethylformamide, cyclohexane, dichloroethane, cyclohexanone, acetonitrile, 2-ethoxyethanol, acetone, 4-butyrolactone, ethylene glycol monomethyl ether acetate, and mixtures of these solvents with each other or with one or more of a lower alcohol and ketone.

The concentrations of light sensitive polymers in the coating solutions are dependent upon the nature of the light sensitive materials, the supports and the coating methods employed. Particularly useful coatings are obtained when the coating solutions contain 0.05 to 15 percent, by weight, and preferably from 0.5 to 3 percent, by weight, of light-sensitive material.

Polymers in accordance with the invention are capable of forming thick, continuous film coats on a substrate. In some applications, however, it may be useful to add to coating compositions of such polymers at least one other film-forming polymeric resin. Formulating coating compositions with such resins is accomplished using techniques and materials well known in the art.

Additional components can be included in the coating formulation with the polyacetal-containing polymers described herein. For example, dyes or pigments may be included to obtain colored images. Examples of film forming resins and other coating composition addenda can be found in U.S. Pats. Nos. 3,759,711 (issued Sept. 18, 1973 to F. J. Rauner et al), and 3,859,099 (issued Jan. 7, 1975 to C. C. Petropoulos).

A radiation-sensitive element bearing a layer of the polymeric acetal, polyesteracetal thereof, or end-capped polyacetal, can be prepared by applying a coating composition containing the radiation-sensitive material onto a support in accordance with standard techniques, such as spray coating, dip coating, whirl coating, roller coating, or the like.

Suitable support materials for a radiation-sensitive element according to the invention include fiber base materials such as paper, polyethylene-coated paper, polypropylene-coated paper, parchment, cloth, and the like; sheets and foils of such metals as aluminum, copper, magnesium and zinc; glass and glass coated with such metals as chromium, chromium alloys, steel, silver, gold, and platinum; synthetic polymeric materials such as poly(alkyl methacrylates), e.g. poly(methyl methacrylate), polyesters, e.g. poly(ethylene terephthalate), poly(vinyl acetals), polyamides, e.g., Nylon (trademark), cellulose esters, e.g., cellulose nitrate, cellulose acetate, cellulose acetate propionate, cellulose acetate butyrate, and the like.

Typical lithographic support materials which are useful in our invention include supports such as zinc, anodized aluminum, grained aluminum, copper and specially prepared metal and paper supports; superficially hydrolyzed cellulose ester films; polymeric supports such as polyolefins, polyesters, polyamide, and the like.

The supports can be subcoated with known subbing materials such as copolymers and terpolymers of vinylidene chloride with acrylic monomers (such as acrylonitrile and methyl acrylate) and unsaturated dicarboxylic acids (such as itaconic acid or acrylic acid); carboxymethyl cellulose; polyacrylamide; and similar polymeric materials.

The support can also carry a filter or antihalation layer, such as one comprising a dyed polymer layer which absorbs the exposing radiation after it passes through the radiation-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation.

The optimum coating thickness of the radiation-sensitive layer will depend upon such factors as the use to which the coating will be put, the particular radiation-sensitive polymer employed, and the nature of other components which may be present in the coating. Typical coating thicknesses can be from about 0.005 to 0.3 mil or greater with thicknesses of 0.025 to 0.1 mil being preferred for printing plate applications.

After coating, the element is dried, optionally at an elevated temperature to remove residual solvent.

The radiation-sensitive elements employed in the invention can be imagewise exposed, for example, through a transparency, to an imagewise pattern of actinic radiation which is preferably rich in ultraviolet light. Suitable exposure means include carbon arc lamps, mercury vapor lamps, fluorescent lamps, tungsten filament lamps, lasers, and the like. The exposed elements are then developed by flushing, soaking, swabbing, or otherwise treating the light-sensitive layers with a solvent or solvent system which exhibits a differential solvent action on the exposed and unexposed materials. These developing solvents are preferably non-aqueous liquids, such as lower alcohols, in particular, methanol; ketones; alkoxyalkanols, particularly 2-ethoxyethanol; and mixtures of such liquids. Aqueous developers are also useful, in which case the developer has a pH within the range from about 2 to about 10, preferably about 6 to 10. The alkaline strength of the developer is dependent primarily upon the particular polymeric acetal used, other resins which may be employed and the proportions of the various components. The developer can also contain dyes, pigments and/or hardening agents. Development is carried out typically at a temperature within the range from about 18° C. to about 35° C. The developed image is rinsed with distilled water and dried optionally at elevated temperatures. The resulting images can then be treated in any known manner consistent with their intended use, such as with desensitizing etches, plate lacquers, and the like, when used as a printing plate; or with acidic or basic etchants or plating baths when used as a resist.

By employing coatings of a radiation-sensitive polymer described according to the invention, it has been demonstrated that upon imagewise exposure to actinic radiation, the polyacetal containing backbone is in fact degraded and the resulting degradation products (non-image areas) are capable of being dissolved and washed away efficiently with, for example, a 3:1 by volume methanol:2-ethoxyethanol developer. Remaining regions of unexposed polymer, however, form good positive images. It is believed that photodegradation of the polymer proceeds in the following theoretical manner:

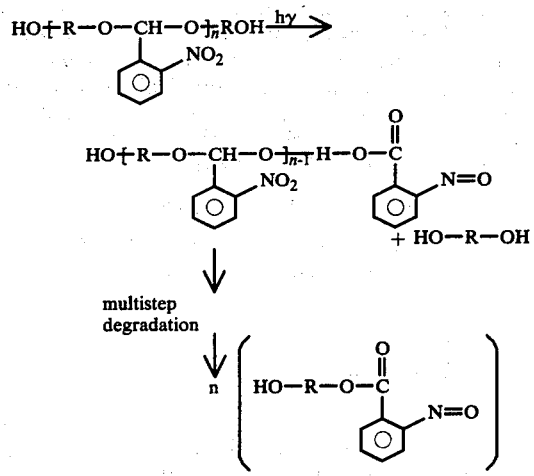

Infrared spectrum analysis supports the above mechanism. After exposure, a carbonyl peak appears in the 5.8μ region where little or none was apparent before exposure. A large simultaneous increase of hydroxyl also appears in the 2.9μ region of the exposed spectrum. While the above theoretical mechanism illustrates the degradation of a polyacetal (i.e., where y is O in the generic structure of polymers of the invention), it is believed that polyesteracetals (y equals 1) and end-capped polyacetals will similarly degrade when exposed to actinic radiation.

As noted, polyacetal containing radiation-sensitive materials described herein are thermally stable at at least room temperatures. Such stability has been demonstrated in several ways. For example, in the preparation of the polymers per se, the reaction medium is refluxed at temperatures ranging from 140° C. to 180° C. for periods of from 3 to 12 hours, producing thereby polymers with good photosensitivity. Furthermore, these polyacetal containing polymers have been stored at ambient room temperatures for periods of more than two years, coated on a support, imagewise exposed, and developed to produce positive images of quality substantially undistinguished from the quality of an image formed by a freshly made polymer.

It has also been shown that polyacetal containing polymers described herein can, in combination with photosensitizing materials such as 9-xanthone, be made several times more responsive to actinic radiation than the same polymer without such added sensitizer.

The following examples are intended to further help in understanding the invention:

EXAMPLE 1

Preparation of Polyacetals

Poly(o-nitrobenzaldehyde 1,4-cyclohexylenedimethylene acetal)

A 1 liter flask equipped with stirrer, Dean Stark trap, thermometer and nitrogen inlet was charged with 75.5 g (0.5 M) o-nitrobenzaldehyde, 72 g (0.5 M) 1,4-cyclohexanedimethanol, 0.08 g p-toluenesulfonic acid monohydrate and 300 ml of toluene. The contents were heated to reflux (111° C.) under a nitrogen blanket and 5.5 ml of water were removed over a period of 4 hours. After a total of 46 hours only half of the water was removed during azeotropic reflux conditions. Most of the toluene was distilled and then the temperature of the pot was raised to 180° C. and a 0.5 mm Hg vacuum was applied for a period of 3 hours. The hot melt was poured into a pan lined with aluminum foil, cooled and ground. A yield of 130 g (94%) of an amber colored resin was obtained. End group analysis indicated that the polymer contained $5.29 \times 10^{-4}$ equivalents of hydroxyls per gram of sample (or 0.529 milliequivalents per gram). The proposed structure based on the end group analysis is as follows:

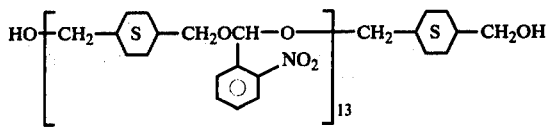

Elemental Analysis: C, 65.0; H, 6.9; N, 5.1 Theory. C, 65.1; H, 7.1; N, 4.8 Found.

Inherent viscosity was 0.08 (0.25 g/deciliter in 1,2-dichloroethane at 25° C. ). Number average molecular weight by vapor phase osmometry was 4581. NMR results were consistent with the above structure.

EXAMPLE 2

Poly(o-nitrobenzaldehyde-1,4-cyclohexylene acetal)

This polymer was prepared in the same manner as that in example 1 from 0.5 M of o-nitrobenzaldehyde, 0.5 M of 1,4-cyclohexanediol, and 0.05 g of p-toluenesulfonic acid monoydrate. A yield of 92.2 g of resin was obtained. End group analysis gave a value of $5.25 \times 10^{-4}$ equivalents of hydroxyls per gram of sample which corresponds to about 15 repeating units.

The proposed structure based on the end group analysis is as follows:

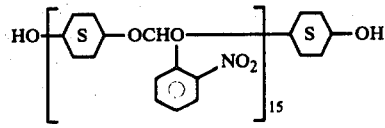

Elemental Analysis: Calculated: C, 62.6; H, 6.2; N, 5.5. Found: C, 62.6: H, 6.0; N, 5.5.

The inherent viscosity in 1,2-dichloroethane at 0.25 g/deciliter at 25° C. was 0.09.

The NMR spectrum was consistent with the above structure.

EXAMPLE 3

Poly[o-nitrobenzaldehyde-2,2-isopropylidene-bis(1,4-cyclohexylene) acetal ]

This polymer was prepared in the same manner as that in example 1 from 0.5 M of o-nitrobenzaldehyde, 0.5 M of 2,2-bis(4-hydroxycyclohexyl) propane and 0.04 g of p-toluenesulfonic acid monohydrate. A yield of 158 g of resin was obtained. End group analysis gave a value of $7.5 \times 10^{-4}$ equivalents of hydroxyls per gram of sample which corresponds to about 6 repeating units.

The proposed structure based on the end group analysis is as follows:

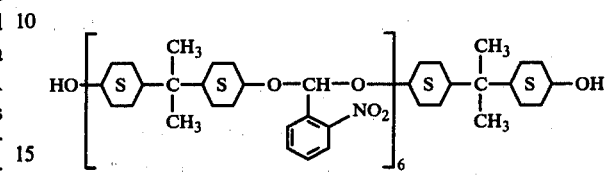

Analysis Calculated: C, 71.1; H, 8.7; N, 3.4. Found: C, 71.3 H, 8.8; N, 3.3.

Inherent Viscosity in 1,2-dichloroethane at 0.25 g/deciliter at 25° C. was 0.07.

The NMR spectrum was consistent with the above structure.

EXAMPLE 4

Poly(o-nitrobenzaldehyde-2,5(6)-norbornylene acetal)

This polymer was prepared in the same manner as that in example 1 from 0.5 M of of o-nitrobenzaldehyde, 0.5 M of 2,5(6)-norbornanediol and 0.05 g p-toluenesulfonic acid monohydrate. A yield of 112 g of resin was obtained. End group anaylsis gave a value of $6.5 \times 10^{-4}$ equivalents of hydroxyls per gram of sample which corresponds to about 11 repeating units.

The proposed structure based on the end group analysis is as follows:

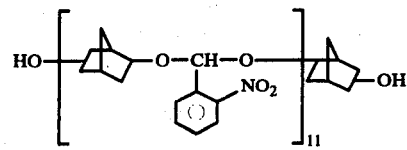

Elemental Analysis Calculated: C, 64.4; H, 5.9; N, 5.1. Found: C, 64.1; H, 6.0; N, 5.2.

Inherent Viscosity in 1,2-dichloroethane at 0.25 g/deciliter at 25° C. was 0.07.

The NMR spectrum was consistent with the above structure.

EXAMPLE 5

Poly[o-nitrobenzaldehyde-1,4-cyclohexylenebis (oxyethylene) acetal ]

This polymer was prepared in the same manner as that in example 1 from 0.5 M of o-nitrobenzaldehyde, 0.5 M of 1,4-dihydroxyethoxycyclohexane and 1 g p-toluenesulfonic acid monohydrate. A yield of 150 g of tacky resin was obtained. End group analysis gave a value of $5.3 \times 10^{-4}$ equivalents of hydroxyls per gram of sample which corresponds to about 11 repeating units.

The proposed structure based on the end group analysis is as follows:

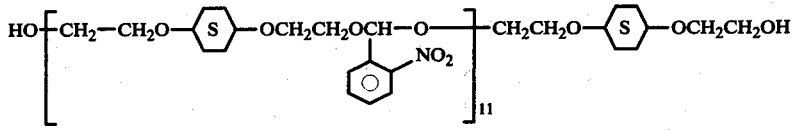

Elemental Analysis: Calculated: C, 60.4; H, 7.0; N, 3.9. Found: C, 60.0; H, 7.2; N, 4.3.

The NMR spectrum was consistent with the desired product.

EXAMPLE 6

Poly(o-nitrobenzaldehyde-sulfonyldiethylene acetal)

This polymer was prepared in the same manner as that in example 1 from 0.3 M of o-nitrobenzaldehyde, 0.3 M of bis(2-hydroxyethyl) sulfone and 0.03 g p-toluenesulfonic acid monohydrate. A yeild of 50 g of a tacky resin was obtained. End group analysis gave a value of $7 \times 10^{-4}$ equivalents of hydoxyls per gram of sample which corresponds to about 9 repeating units.

The proposed structure, based on the end group analysis, is as follows:

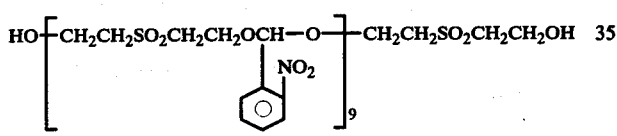

Elemental Analysis: Calculated: C, 45.2; H, 4.7; N, 4.6; S, 11.7. Found: C, 45.0; H, 4.9; N, 4.7; S, 11.7.

The NMR spectrum was consistent with the desired product.

EXAMPLE 7

Preparation of Polyesteracetals

Poly[o-nitrobenzylidenedioxybis(cyclohexylenedimethylene) terephthalate]

A 1 liter flask equipped with stirrer, thermometer, nitrogen inlet, and a heavier than water Dean Stark trap was charged with 37.8 g (0.25 M) o-nitrobenzaldehyde, 72.1 g (0.5 M) 1,4-cyclohexanedimethanol, 0.08 g p-toluenesulfonic acid monohydrate, 300 ml of 1,2-dichloroethane and heated to reflux. After 5 hours, 3 ml of water were collected. A total of 225 ml of 1,2-dichloroethane were then distilled and the contents in the pot were then heated at 140° C. overnight.

The contents of the flask were cooled to 50° C. and 300 ml of 1,2-dichloroethane and 30.3 g triethylamine were added. To this, 50.8 g (0.25 M) of terephthaloyl chloride were than added slowly and the temperature rose to 80° C. The contents of the flask were refluxed for 4 hours and allowed to cool to room temperature overnight. Triethylamine hydrochloride was separated. The filtrate was added dropwide to 6 liters of isopropyl alcohol to precipitate the polymer. The polymer was washed with isopropyl alcohol, then ether, and dried in a vacuum oven for 4 hours at 60° C., and overnight at room temperature. A yield of 102 g (74%) straw colored solid was obtained.

Analysis, based on end group analysis, was consistent with the following structure of the repeating unit:

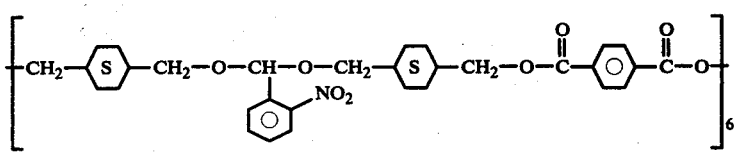

Elemental Analysis: Calculated: C, 67.5; H, 6.8; N, 2.5. Found: C, 67.4; H, 7.0; N, 2.4.

Inherent viscosity in 1,2-dichloroethane at 0.25 g/deciliter at 25° C. was 0.04.

Number average molecular weight by vapor phase osmometry was 4500.

NMR results were consistent with above structure.

EXAMPLE 8

Poly[poly(o-nitrobenzaldehyde-1,4-cyclohexylenedimethylene acetal) terephthalate]

A 3-necked flask equipped with a thermometer, stirrer and dropping funnel was charged with 50 g (0.125 M) of the polymer prepared in example 1,500 ml of 1,2-dichloroethane and 2.53 g (0.25 M) of triethylamine. The solution was stirred at room temperature and a solution of 2.54 g (0.125 M) of terephthaloyl chloride in 25 ml of 1,2-dichloroethane was added dropwise. Stirring was continued at room temperature for 18 hours and then refluxed for 4 hours. The reaction solution was cooled and concentrated by evaporating some of the 1,2-dichloroethane. The polymer was isolated by precipitating into 3 l of isopropyl alcohol, filtering and drying in a vacuum oven. Yield was 55 g. Analysis was consistent with the following structure of the repeating unit:

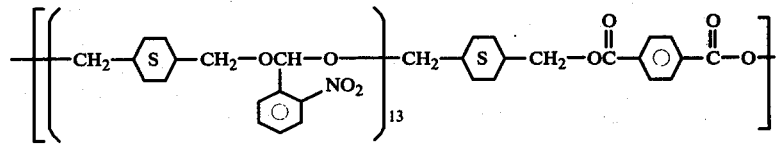

Elemental Analysis: Calculated: C, 65.3; H, 6.7; N, 4.7. Found: C, 64.0; H, 7.6; N, 4.3.

Inherent viscosity in 1,2-dichloroethane at 0.25 g/deciliter at 25° C. was 0.18.

The NMR spectra was consistent with the above structure.

EXAMPLE 9

Preparation of End-Capped Polyacetals

Poly(o-nitrobenzaldehyde-1,4-cyclohexylene-dimethylene acetal) dibenzoate

A 300 ml flask equipped with a stirrer and thermometer was charged with 25 g (0.013 equivalents) of the polymer prepared in example 1, 100 ml of 1,2-dichloroethane and 4 ml of triethylamine. The solution was cooled in an ice bath and 3 ml (0.026 equivalents) of benzoyl chloride were added. The contents of the reaction flask were allowed to warm to room temperature over a period of 24 hours and 1 g triethylamine hydrochloride was separated. The filtrate was added dropwise to 700 ml of methanol to precipitate the polymer.

The product was washed with methanol, then hexane, and dried in a vacuum oven at 95° C. for 6 hours, and thereafter at room temperature overnight. A yield of 25 g (95%) of an amber resin was obtained. Analysis was consistent with the following structure:

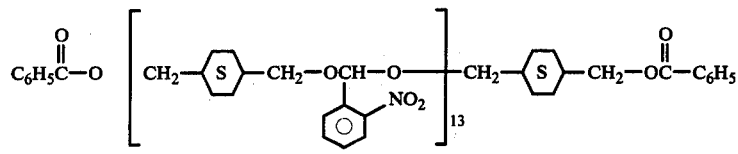

Elemental Analysis: C, 65.9; H, 6.9; N, 4.6 Calculated C, 62.9; H, 6.9; N, 4.6 Found Inherent viscosity in 1,2-dichloroethane at 0.25 g/deciliter at 25° C. was 0.08.

NMR was consistent with the above structure.

Radiation-Sensitive Elements

EXAMPLE 10

A 2% by weight solution in 1,2-dichloroethane of a polymer prepared as described in Example 1 was coated on a grained aluminum plate. After drying, the plate was imagewise exposed through a continuous tone positive transparency by moving the plate at a rate of 2 feet per minute past a 1200 watt high-pressure mercury lamp at a plate-to-lamp distance of about 1 inch. The plate was swab developed with a 3:1 by volume solution of methanol: 2-ethoxyethanol. Development removed the exposed areas. The residual polymer took ink and the non-image areas remained clean.

EXAMPLE 11

A 4% by weight solution in 1,2-dichloroethane of a polymer, prepared as described in example 1, to which 5% by weight based on polymer of Monastral Blue BF pigment (DuPont) was added, was flow coated on a grained aluminum plate. After drying, the plate was exposed through a half-tone positive transparency for 3 minutes with a 2000 watt xenon lamp at a plate-to-lamp distance of about 16 inches. The plate was swab developed as described in example 10. Development removed the exposed areas and the residual polymer appeared as a blue pigmented image of the original positive transparency.

EXAMPLE 12

Two plates were prepared as described in example 11, a control and one which was sensitized with 4% by weight (based on polymer) of 9-xanthone. The two plates were exposed and developed as described in example 11 and inked. The use of control scale test strips showed that the sensitized plate containing the 9-xanthone was about 4 times faster than the control.

EXAMPLE 13

A 2% by weight solution in 1,2-dichloroethane of a polymer prepared and described in example 2 was flow coated on a grained aluminum plate, exposed, developed, and inked as described in example 10. Development removed the exposed areas. The residual polymer took ink and the non-image areas remained clean.

EXAMPLE 14

A 2% by weight solution in 1,2-dicholoroethane of a polymer prepared as described in example 3 was flow coated on a grained aluminum plate, exposed, developed, and inked as described in example 10. Development removed the exposed areas. The residual polymer took ink and the non-image areas remained clean.

EXAMPLE 15

A 2% by weight solution in 1,2-dichloroethane of a polymer prepared as described in example 4 was flow coated on a grained aluminum plate, exposed, developed, and inked as described in example 10. Development removed the exposed areas. The residual polymer took ink and the non-image areas remained clean.

EXAMPLE 16

A 2% by weight solution in 1,2-dichloroethane of a polymer prepared as described in example 7 was flow coated on a grained aluminum plate, exposed, developed, and inked as described in example 10. Development removed the exposed area. The residual polymer took ink and the non-image areas remained clean.

EXAMPLE 17

A 4% by weight solution of the polymer prepared in example 8 was flow coated on two grained aluminum plates. After drying, the plates were exposed through a half tone positive transparency for 2 minutes with a 400 watt high-pressure mercury lamp at a plate-to-lamp distance of about 12 inches. Swab development of one of the plates with only 2-ethoxyethanol gave images of the same quality as did the polymer in Example 12 without the 9-xanthone sensitizer and the polymer described in Example 16. The image areas of the above-mentioned polymers of Example 12 and 16 were washed off completely when developed with straight 2-ethoxyethanol.

EXAMPLE 18

A 2% by weight solution in 1,2-dichloroethane of a polymer prepared as described in example 9 was flow coated in a grained aluminum plate, exposed, developed, and inked as described in example 10. Development removed the exposed areas. The residual polymer took ink and the non-image areas remained clean.

While the radiation-sensitive polyacetal containing polymers of this invention have been disclosed as useful in forming lithographic plates (as shown in the above examples), it is to be understood that these polymers can be used for other purposes. For example, the polymers can also be used as photoresists using techniques well-known to those skilled in the art.

This invention has been described in detail with particular reference to preferred embodiments thereof, but it will be understood that variations and modification can be effected within the spirit and scope of the invention.

What is claimed is:

1. A radiation-sensitive composition comprising a radiation-sensitive linear polymer comprising recurring units of the structure

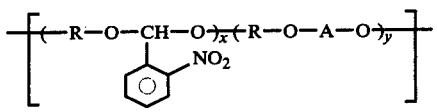

where
x ranges from 1 to 20 and
y is 0 or 1,
R is the divalent residue of an organic diol capable of forming a linear polyacetal with an aldehyde,
A is

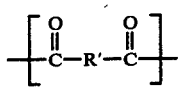

where R' is arylene, and a solvent for said polymer.

2. The radiation-sensitive composition of claim 1 wherein y is 0 and R is a divalent group comprising at least one divalent carbocylic moiety having a cyclic nucleus with 4 to 7 carbon atoms.

3. The radiation-sensitive composition of claim 1 wherein y is 0 and R is the divalent residue of an alkylene diol having 5 to 15 carbon atoms.

4. The radiation-sensitive composition of claim 5 wherein y is 0 and R is the divalent residue of an alkylene diol having 4 to 15 carbon atoms interrupted by at least one hetero atom.

5. The radiation-sensitive composition of claim 1 wherein y is 1 and R is a divalent group comprising at least one divalent carbocylic moiety having a cyclic nucleus with 4 to 7 carbon atoms.

6. The radiation-sensitive composition of claim 1 wherein y is 1 and R is the divalent residue of an alkylene diol having 5 to 15 carbon atoms.

7. The radiation-sensitive composition of claim 1 wherein y is 1 and R is the divalent residue of an alkylene diol having 4 to 15 carbon atoms interrupted by at least one hetero atom.

8. The radiation-sensitive composition of claim 2 wherein said solvent is 1,2-dichloroethane.

9. The radiation-sensitive composition of claim 8, further comprising 9-xanthone sensitizer.

10. A radiation-sensitive element comprising a support bearing a layer of a radiation-sensitive linear polymer comprising recurring units of the structure

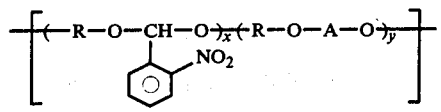

where
x ranges from 1 to 20 and
y is 0 or 1,
R is the divalent residue of an organic diol capable of forming a linear polyacetal with an aldehyde,
A is

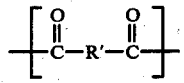

where R' is arylene.

11. The radiation-sensitive element of claim 10 wherein y is 0 and R is a divalent group comprising at least one divalent carbocyclic moiety having a cyclic nucleus with 4 to 7 carbon atoms.

12. The radiation-sensitive element of claim 10 wherein y is 0 and R is the divalent residue of an alkylene diol having 5 to 15 carbon atoms.

13. The radiation-sensitive element of claim 10 wherein y is 0 and R is the divalent residue of an alkylene diol having 4 to 15 carbon atoms interrupted by at least one hetero atom.

14. The radiation-sensitive element of claim 10 wherein y is 1 and R is a divalent group comprising at least one divalent carbocyclic moiety having a cyclic nucleus with 4 to 7 carbon atoms.

15. The radiation-sensitive element of claim 10 wherein y is 1 and R is the divalent residue of an alkylene diol having 5 to 15 carbon atoms.

16. The radiation-sensitive element of claim 10 wherein y is 1 and R is the divalent residue of an alkylene diol having 4 to 15 carbon atoms interrupted by at least one hetero atom.

17. A radiation-sensitive element comprising an aluminum support and a layer of a radiation-sensitive linear polymer comprising recurring units of the structure

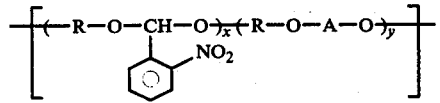

where
x ranges from 1 to 20 and y is 0,
R is a divalent residue of an organic diol capable of forming a linear polyacetal with an aldehyde, said residue comprising at least one divalent carbocyclic moiety having a cyclic nucleus with 4 to 7 carbon atoms,
A is

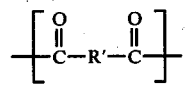

where R' is arylene.

18. A process for preparing an image which comprises imagewise exposing to actinic radiation a radiation-sensitive element comprising a support bearing a layer of a radiation-sensitive linear polymer comprising recurring units of the structure

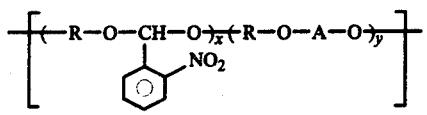

where
x ranges from 1 to 20 and y is 0 or 1,
R is the divalent residue of an organic capable of forming a linear polyacetal with an aldehyde, A is

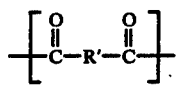

where R' is arylene
to effect a difference in solubility between exposed and unexposed areas of the element, and developing an image by removing the exposed areas with a solvent therefore which is a non-solvent for the unexposed areas.

* * * * *